United States Patent
Park

(12) 
(10) Patent No.: US 6,285,053 B1
(45) Date of Patent: Sep. 4, 2001

(54) CAPACITOR FOR A SEMICONDUCTOR MEMORY DEVICE

(75) Inventor: Byung-Jun Park, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/370,558

(22) Filed: Aug. 9, 1999

(30) Foreign Application Priority Data

Aug. 7, 1998 (KR) ................................. 98-32237

(51) Int. Cl.[7] .................. H01L 27/108; H01L 29/94
(52) U.S. Cl. ............................. 257/306; 257/303
(58) Field of Search .......................... 257/302, 301, 257/303, 300, 310, 307, 306, 246, 758; 438/244, 243, 253, 239, 396, 397, 398

(56) References Cited

U.S. PATENT DOCUMENTS

| | | | |
|---|---|---|---|
| 5,329,146 | * | 7/1994 | Soeda ..................... 257/303 |
| 5,392,189 | * | 2/1995 | Fazan et al. ............. 361/305 |
| 5,869,860 | * | 2/1999 | Widmann et al. ....... 257/304 |
| 5,981,369 | * | 11/1999 | Yoshida et al. ......... 438/597 |
| 6,010,943 | * | 1/2000 | Liao ......................... 438/397 |
| 6,071,773 | * | 6/2000 | Lee et al. ................. 438/253 |
| 6,124,182 | * | 9/2000 | Tu et al. ................... 438/396 |

FOREIGN PATENT DOCUMENTS

362249473 * 10/1987 (JP) ...................... 257/303

* cited by examiner

Primary Examiner—Steven Loke
Assistant Examiner—Douglas W. Owens
(74) Attorney, Agent, or Firm—Marger, Johnson & McCollom, P.C.

(57) ABSTRACT

A capacitor in a semiconductor substrate with a first insulating layer deposited thereon. The capacitor is formed by etching the first insulating layer to simultaneously form first and second self-aligned contact pads to be electrically connected to the substrate. A second insulating layer is deposited over the first insulating layer. Next, a storage node landing pad is formed in the second insulating layer between bit lines to be electrically connected to the first self-align contact pad. Following the formation of the landing pad, a third insulating layer is formed over the second insulating layer with a thickness large enough to provide a desired capacitance. Then, the third insulating layer is etched until the upper surface of the landing pad is exposed so as to form a storage node contact hole. A first conductive layer is deposited on the surfaces of the storage node contact hole and etched to form capacitor lower electrodes. A capacitor dielectric layer is deposited on the third oxide layer, the capacitor lower electrodes and the landing pad. Therefore, the effective area of the capacitor is increased by forming the capacitor electrodes on the sidewalls of contact holes within the oxide layer on the storage node landing pad.

11 Claims, 13 Drawing Sheets

CAPACITOR FOR A SEMICONDUCTOR MEMORY DEVICE

This application relies for priority upon Korean Patent Application No. 98-32237, filed on Aug. 7, 1998, the content of which are herein incorporated by reference in their entirety.

BACKGROUND OF THE INVENTION

1. Field of the Invention

The present invention relates to a semiconductor memory device and, more particularly, to a method for fabricating capacitors in a DRAM device.

2. Background of the Invention

Modern VLSI technology allows integration of 4 Giga bit DRAM, which requires the feature length of the device dimension to be less than 0.15 μm. Also, the contact hole size and the mis-alignment margin has to be reduced. The self-aligned contact process has been developed to reduce the contact hole size and to increase the degree of alignment in photolithography. The self-aligned contact process also reduces the contact resistance because the whole contact area is effective regardless of the reduction of the contact hole size.

The conventional process of fabricating capacitors in a semiconductor device will be described with reference to FIGS. 1A to 1D, as follows:

Referring to FIG. 1A, a semiconductor substrate 10 is firstly provided with shallow trench isolations 12 to define active and inactive regions, and then covered with a first oxide layer 14. The first oxide layer 14 is selectively etched according to a contact hole patterning mask to form the self-aligned contact holes for storage node contact pads 16. The storage node contact pads 16 are formed by planarizing a polysilicon layer deposited over the substrate by CMP (Chernical-Mechanical Polishing) until the first oxide layer 14 is exposed. Thus, the storage node contact pad 16 is electrically connected to the substrate 10. Subsequently, a second oxide layer 18 is deposited over the first oxide layer 14 embedding the storage node contact pads 16 as shown in FIG. 1B, then etched according to a bit line contact hole patterning mask to form bit line contact holes (not shown in the drawings). A polysilicon layer is deposited over the second oxide layer 18, then etched until the second oxide layer 18 is exposed to form bit line contact pads (not shown in the drawings). Additionally formed on the second oxide layer 18 are the bit lines 20 electrically connected to the bit line contact pads. The second oxide layer 18 and the bit lines 20 are covered sequentially with a third oxide layer 22, a nitride layer 24 and a fourth oxide layer 26. In this case, the nitride layer 24 serves to protect the bit lines 20 from being oxidized by $O_2$ contained in the dielectric layer of the capacitor produced in the subsequent process steps.

Referring to FIG. 1C, storage node contact holes 27 are formed by sequentially etching the fourth oxide layer 26, nitride layer 24, third oxide layer 22 and second oxide layer 18 according to a storage node contact patterning mask until the upper surfaces of the storage node contact pads 16 are exposed. Referring to FIG. 1D, a polysilicon layer is deposited over the fourth oxide layer 26 containing the storage node contact holes 27. This polysilicon layer is patterned according to a storage node patterning mask to form the storage nodes 30 integrated with the storage node contacts 28. The storage node 30 is formed with a thickness of more than 10000Å. Finally, sequentially deposited over the fourth oxide layer containing the storage nodes 30 are the dielectric layer 32 and the upper electrode 34 of the capacitor.

With the increase in integration size, i.e., the number of transistors and other electronic components packed onto a single IC chip, the misalignment margin is reduced to less than 40 nm between the self-aligned contact pad and storage node contact, storage node contact and storage node, storage node contact and bit line, and storage node contact and gate. Moreover, metallization after forming the storage nodes should suffer considerably reduced margins for DOF (Depth of Focus) due to the level difference of more than 10000Å between the cell and core.

SUMMARY OF THE INVENTION

It is, therefore, an object of the present invention to provide a method of fabricating capacitors capable of reducing current leakage in a semiconductor device.

According to an aspect of the present invention, a method of fabricating capacitors in a semiconductor substrate with a first insulating layer deposited thereon, comprises the steps of etching the first insulating layer to simultaneously form first and second self-aligned contact pads electrically connected with the substrate, depositing a second insulating layer over the first insulating layer, forming bit lines on the second insulating layer with the upper and side surfaces of the bit lines being enclosed by an insulating material having an etching selectivity to the second insulating layer, forming a landing pad between the bit lines to be electrically connected with the first self-align contact pad, the landing pad having the maximum size within such range as not to connect with the second self-aligned contact pad, depositing a third insulating layer over the substrate with a thickness large enough to provide a desired capacitance, etching the third insulating layer according to a storage node contact hole patterning mask until exposing the upper surface of the landing pad so as to form a storage node contact hole, depositing a first conductive layer on the surfaces of the storage node contact hole, and sequentially depositing a capacitor dielectric layer and a second conductive layer over the third insulating layer and first conductive layer.

According to another aspect of the present invention, there is provided a capacitor formed in a semiconductor substrate, which comprises gate electrodes formed on the substrate so as to be enclosed by an insulating material, first and second self-aligned contact pads formed between the gate electrodes so as to electrically connect with substrate, a landing pad deposited on the first self-aligned contact pad to overlap the insulating material on the gate electrode, and storage nodes formed on both sides of a contact hole in an insulating layer deposited on the substrate so as to electrically connect with the landing pad, wherein the landing pad has the maximum size within such a range as not to connect with the second self-aligned contact pad.

The present invention will now described more specifically with reference to the drawings attached only by way of examples.

DETAILED DESCRIPTION OF THE PREFERRED EMBODIMENTS

Figure 1A:
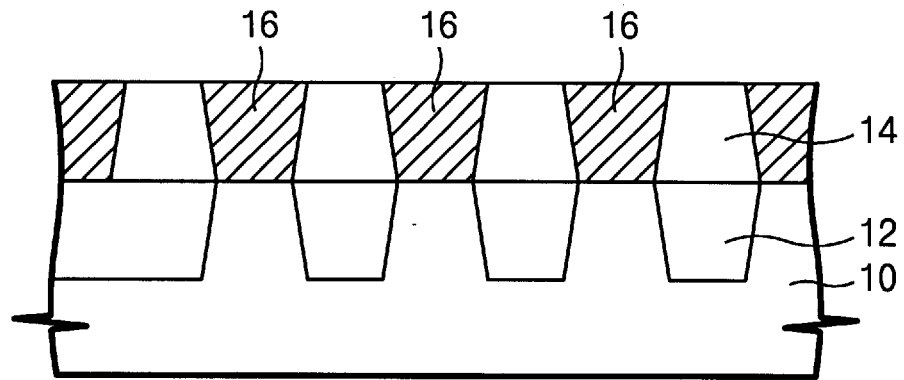
FIGS. 1A to 1D are cross sectional views taken along a word line for illustrating the conventional process steps of fabricating capacitors in a semiconductor substrate.
Figure 1B:
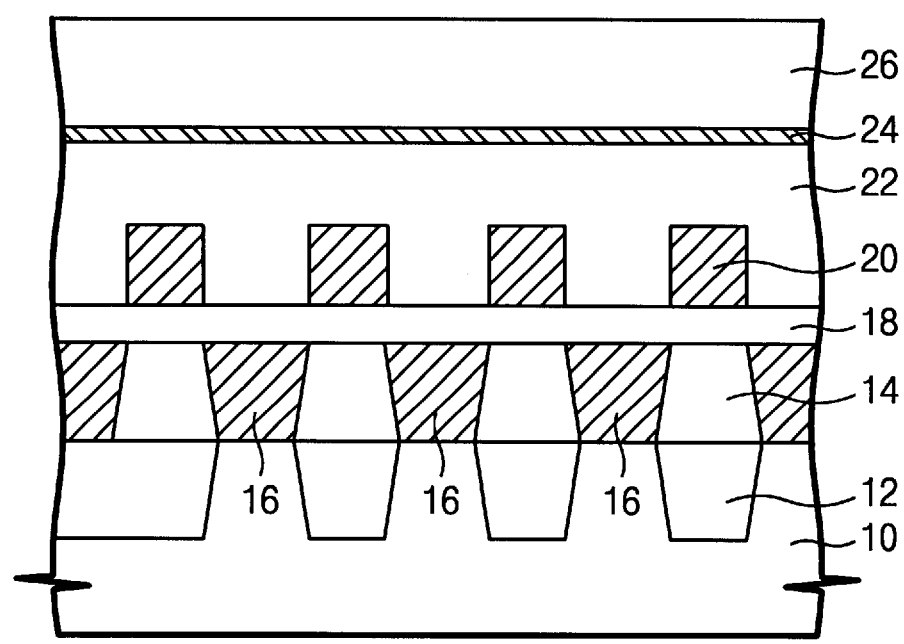
Figure 1C:
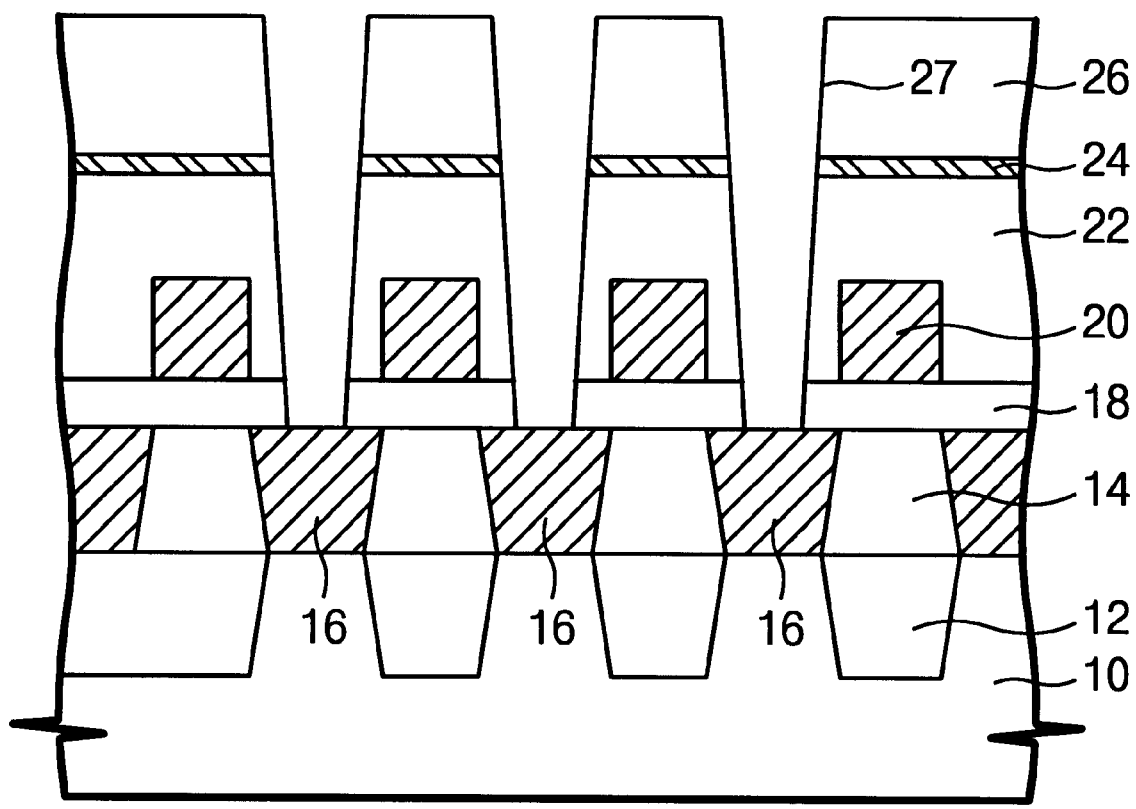
Figure 1D:
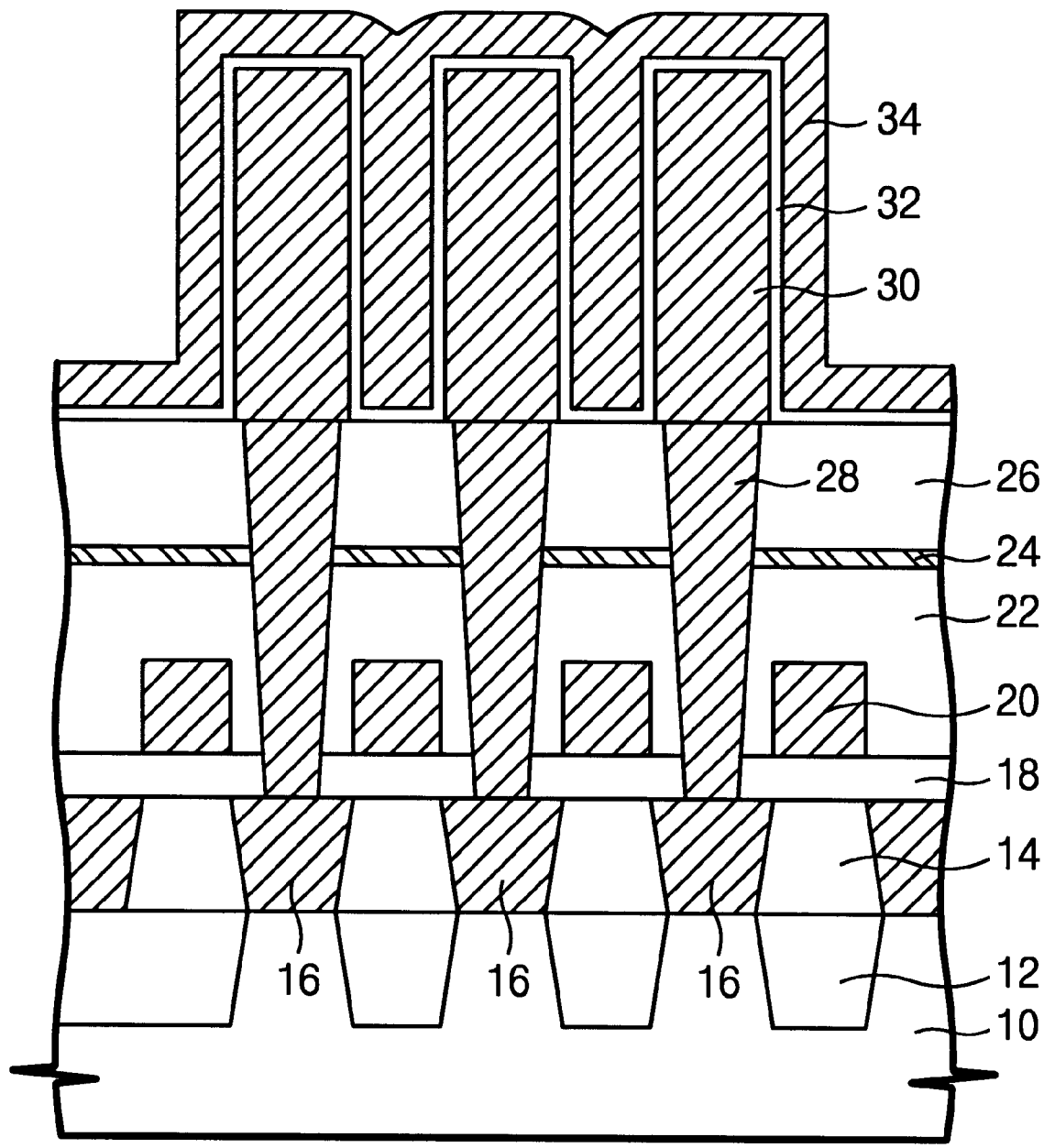
Figure 2A:
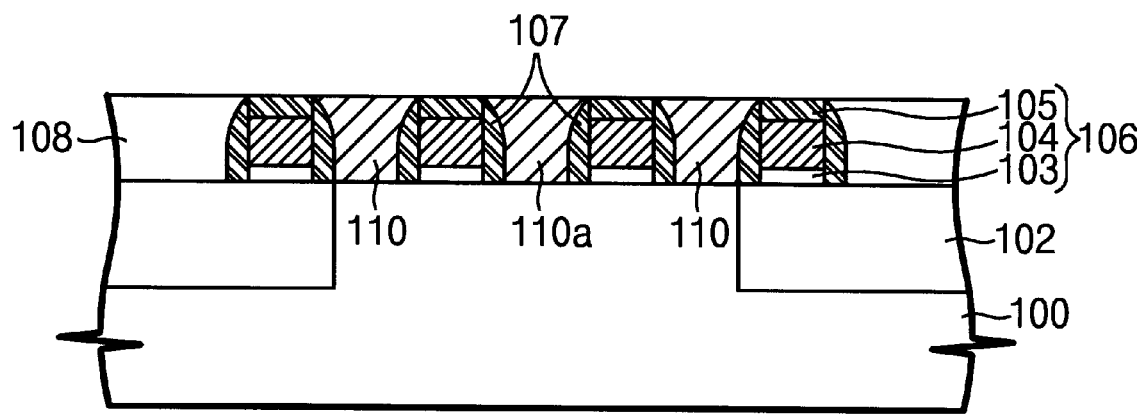
FIGS. 2A to 2F are cross sectional views taken along a bit line for illustrating the inventive method of fabricating capacitors in a semiconductor substrate.
Figure 3A:
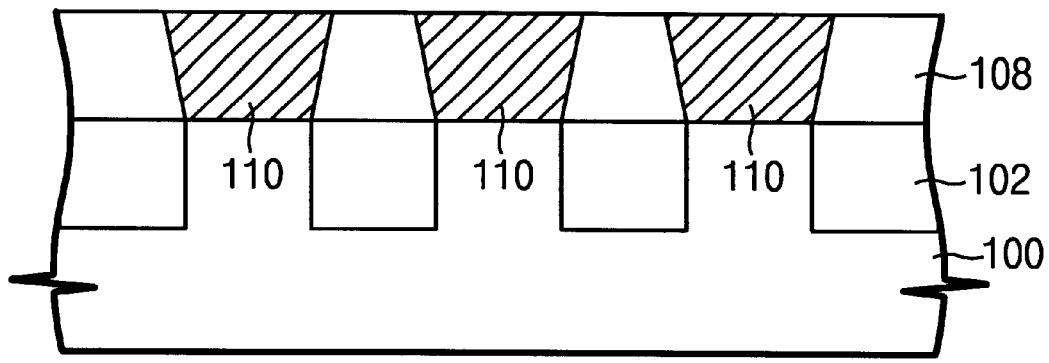
FIGS. 3A to 3F are cross sectional views taken along a word line for illustrating the inventive method of fabricating capacitors in a semiconductor substrate.

Referring to FIGS. 2A and 3A, a semiconductor substrate 100 is provided with trench isolations 102 to define active and inactive regions. Sequentially deposited over the semiconductor substrate 100 are a gate oxide layer 103, a gate conductive layer 104 and a nitride layer 105. The conductive layer 104 may be composed of a polysilicon layer and silicide layer. A gate electrode patterning mask is used to sequentially etch the nitride layer 105 and conductive layer 104 to form gate electrodes 106. A nitride layer is deposited over the substrate 100 with the gate electrodes 106, and then etched back to form spacers 107 on the side walls of the gate electrode. The spacers 107 serve to insulate the conductive layer 104 from the self-aligned contact pads formed in subsequent process steps. A first oxide layer 108 is deposited over the substrate 100 with the gate electrodes 106, and then etched according to a self-aligned contact pad patterning mask to produce contact holes. A polysilicon layer is deposited over the first oxide layer 108 and the contact holes. The polysilicon layer and first oxide layer 108 are etched by CMP until the upper surface of the mask nitride layer 105 is exposed, thereby forming self-aligned contact pads 110, 110a electrically connected to the substrate 100. The self-aligned contact pad 110a electrically connects the bit line with the substrate 100.

Figure 2B:
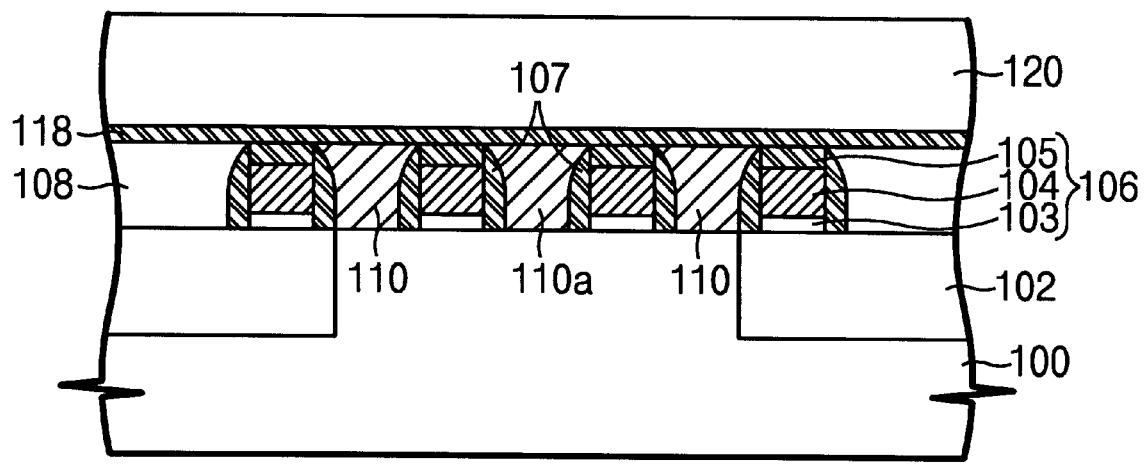
Figure 3B:
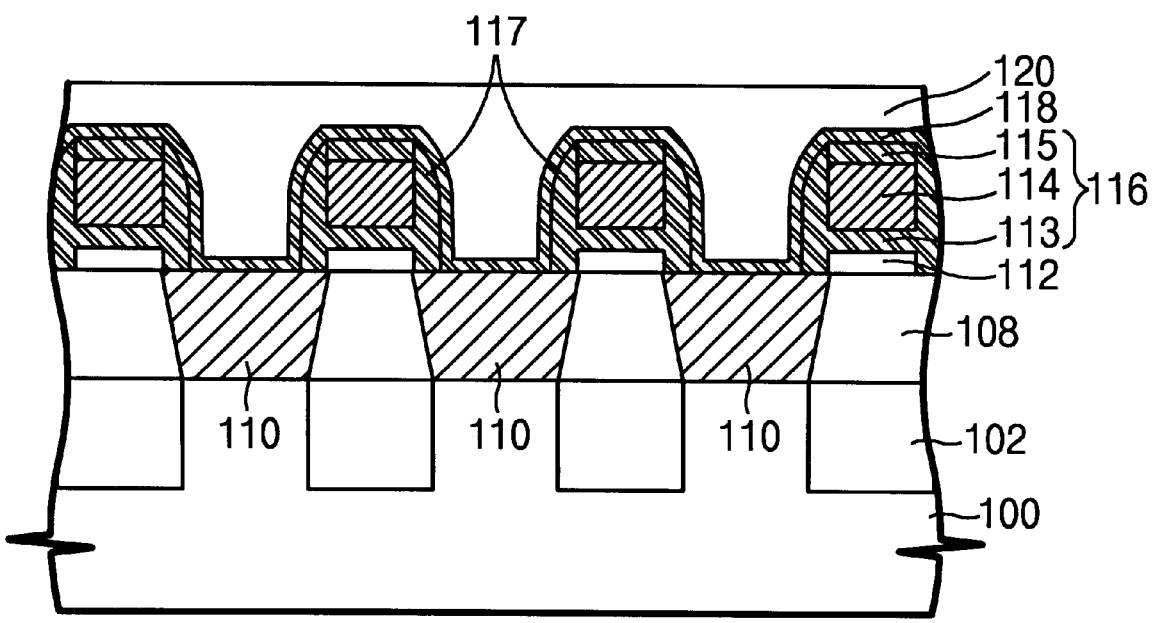

Referring to FIGS. 2B and 3B, a second oxide layer 112 is deposited over the substrate 100 to insulate the self-aligned contact pads 110 from the bit lines formed in subsequent process steps. This is to minimize the consumption of the first oxide layer 108 by making it possible to additionally etch the second oxide layer 112 after etching the subsequent bit lines. A nitride layer 113 is deposited over the second oxide layer 112 with a thickness of about 100 Å. The nitride layer 113 and second oxide layer 112 are sequentially etched by using a bit line contact hole patterning mask until the upper surfaces of the self-aligned contact pads 110a is exposed, thereby forming the bit line contact holes (not shown in the drawings). Sequentially deposited over the nitride layer 113 are a bit line conductive layer 114 and masking nitride layer 115. The conductive layer 114 may be composed of a metal such as tungsten. The mask nitride layer 115, conductive layer 114 and nitride layer 113 are sequentially etched by anisotropic dry etching according to a bit line patterned masking layer to form the bit lines 116 electrically connected with the bit line contacts. Subsequently, the second oxide layer 112 is etched using the bit line patterned masking layer to expose the upper surfaces of the self-aligned contact pads 110a.

After removing the bit line patterned masking layer, a nitride layer, such as a silicon nitride layer, is deposited over the substrate and the bit lines 116 and self-aligned contact pads. The nitride layer is then etched back to form spacers 117 on the side walls of the bit lines 116 and second oxide layers 112. In this case, since the nitride spacers 117 has a poor etching selectivity with respect to the conductive layer 114 of tungsten and has a good etching selectivity with respect to the second oxide layer, the nitride layer 115 is simultaneously etched with the conductive layer 114, and the second oxide layer 112 serves as an etch barrier. For example, when performing wet etching to form landing pad contact holes, the second oxide layer 112 is prevented from being etched because the selectivity of the nitride layer 113 to the second oxide layer 112 is higher than 100:1, thus preventing the storage node landing pad from being connected to the bit line. The mask nitride layer 115 and nitride spacers 117, formed of a material such as silicon nitride, prevent penetration of oxygen into the conductive layer when performing dry oxygen annealing to form a subsequent capacitor dielectric layer of $Ta_2O_5$. A thin nitride layer 118 is deposited over the bit lines 116 and self-aligned contact pads. The thin nitride layer 118 may be formed of silicon nitride. Then, a third oxide layer 120 is deposited and etched by CMP to have a thickness of about 700Å over the bit line 116. The thickness of the third oxide layer 120 polished is preferably about 4000Å.

Figure 2C:
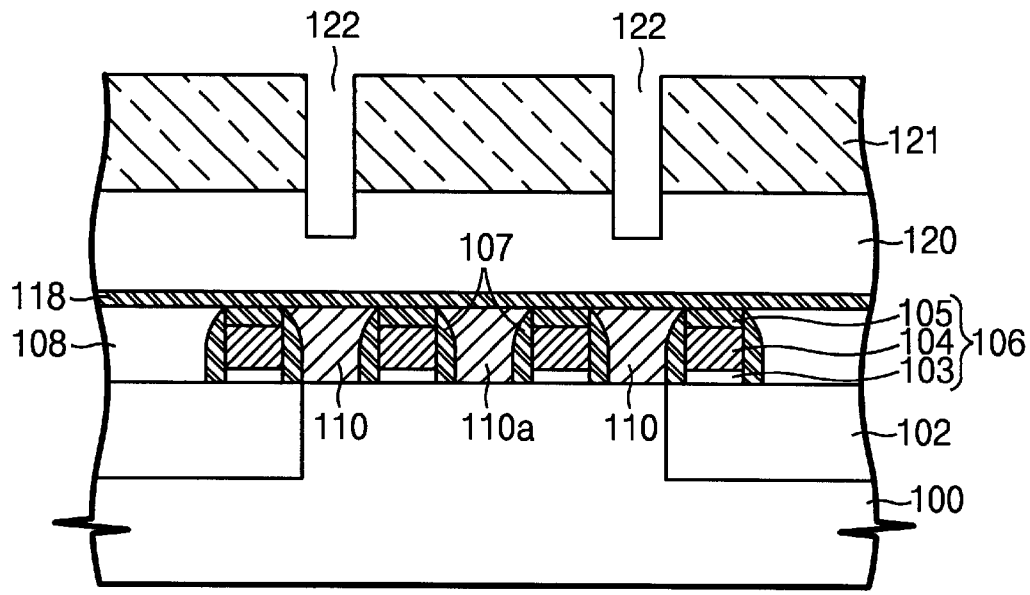
Figure 3C:
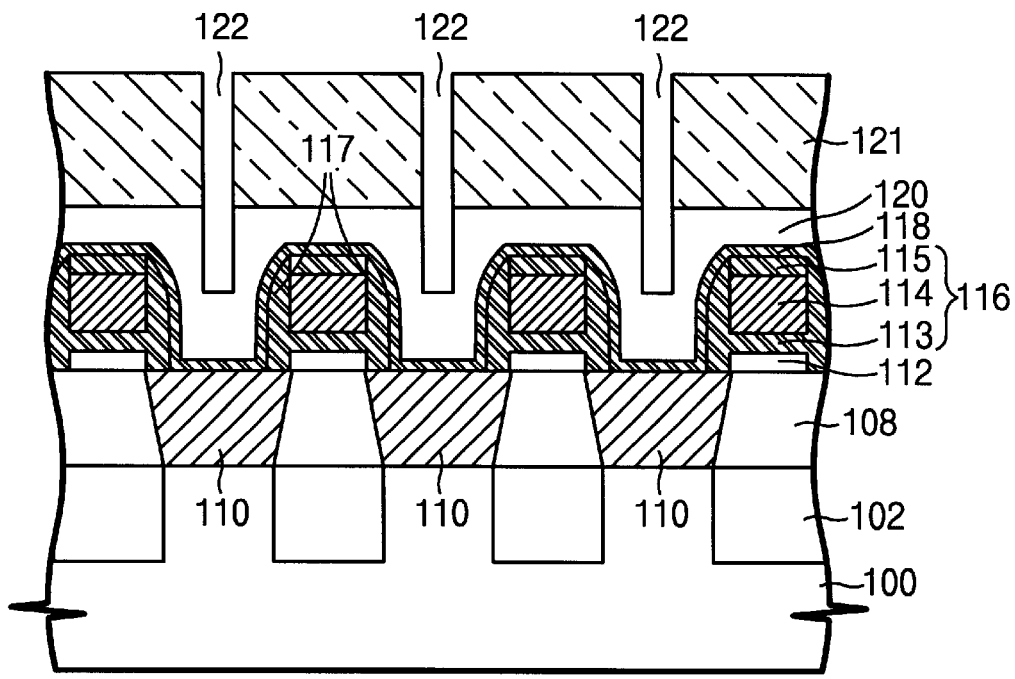
Figure 4A:
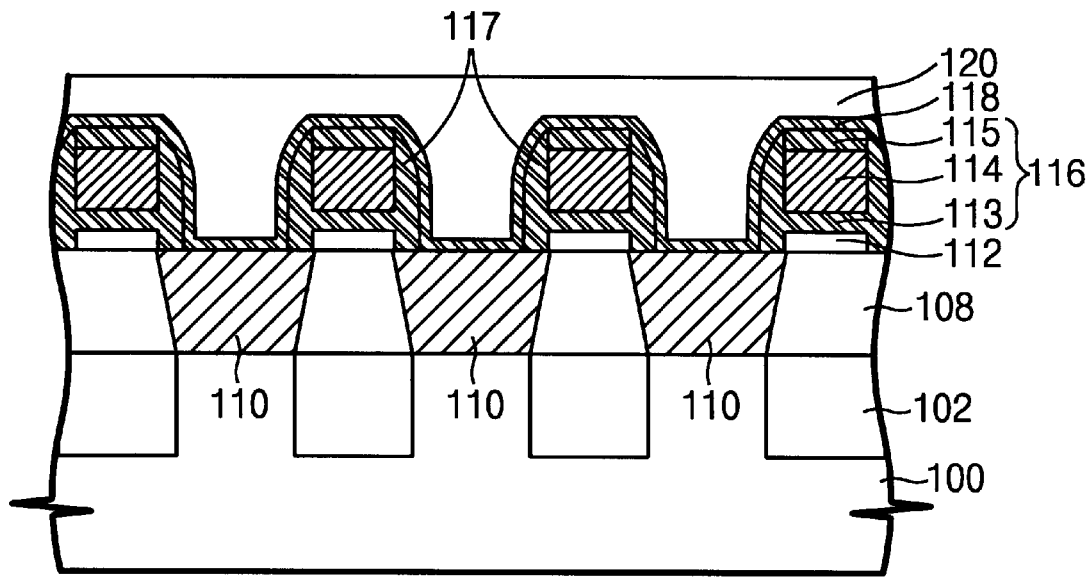
FIGS. 4A and 4B are cross sectional views taken after dry etching according to a photoresist pattern.
Figure 4B:
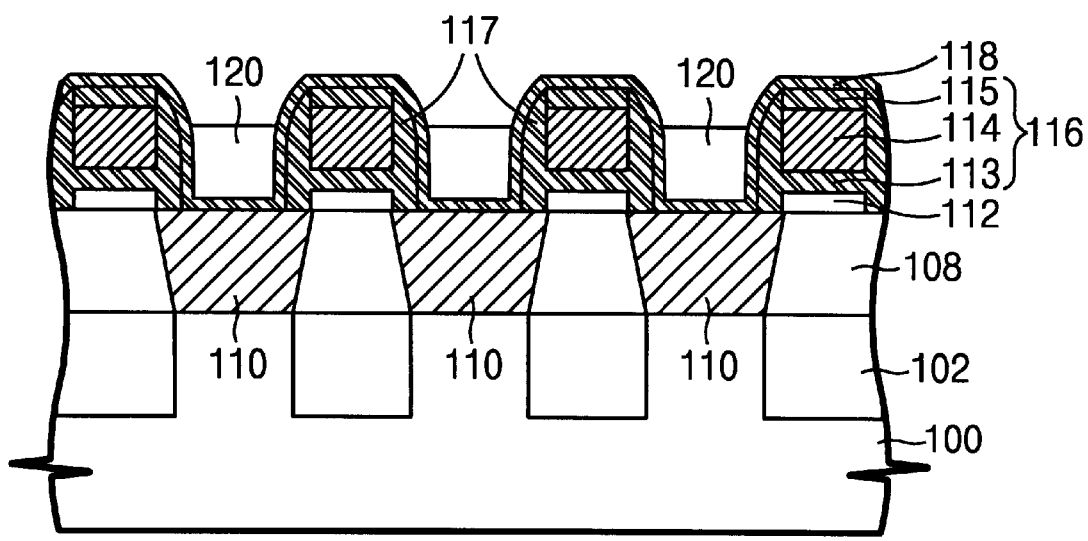

Referring to FIGS. 2C and 3C, the third oxide layer 120 is partially etched by anisotropic dry etching using a patterned photoresist layer 121 as an etching mask for the storage node land pads, thereby forming openings 122. FIGS. 4A and 4B illustrate cross sectional views of the third oxide layer 120 partially etched according to the photoresist layer 121. The amount of partial etching of the third oxide layer 120 should be decided by considering the photo lithographically patterned size and the length etched in the bit line direction during the subsequent wet etching process to form the storage node landing pad contact holes, so that the storage node landing pads are not electrically connected to each other in the bit line direction. For example, when the third oxide layer 120 has a thickness of 4000Å, and the pitch of the cell in the order of 600 nm, the storage node landing pad can have the maximum length of 550 nm with a bridge preventive margin of 50 nm. Hence, it is possible to perform wet etching at maximum 200 nm in one direction excluding the photoresist pattern size of 150 nm. Thus, the storage node landing pad having a length of 550 nm along the word line can be obtained by dry etching of more than 2000Å and subsequent wet etching of about 2000Å.

Figure 2D:
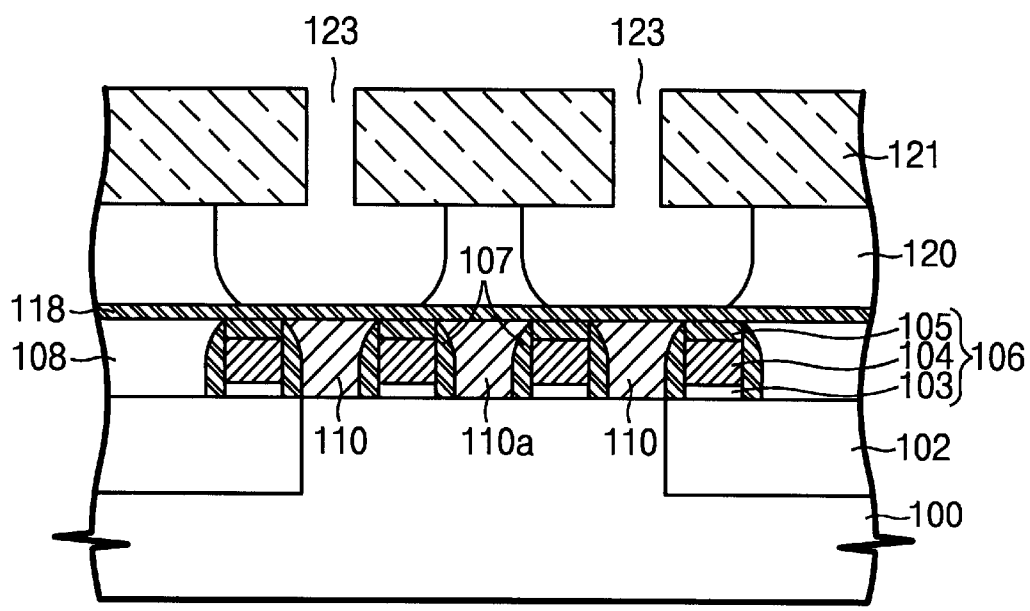
Figure 3D:
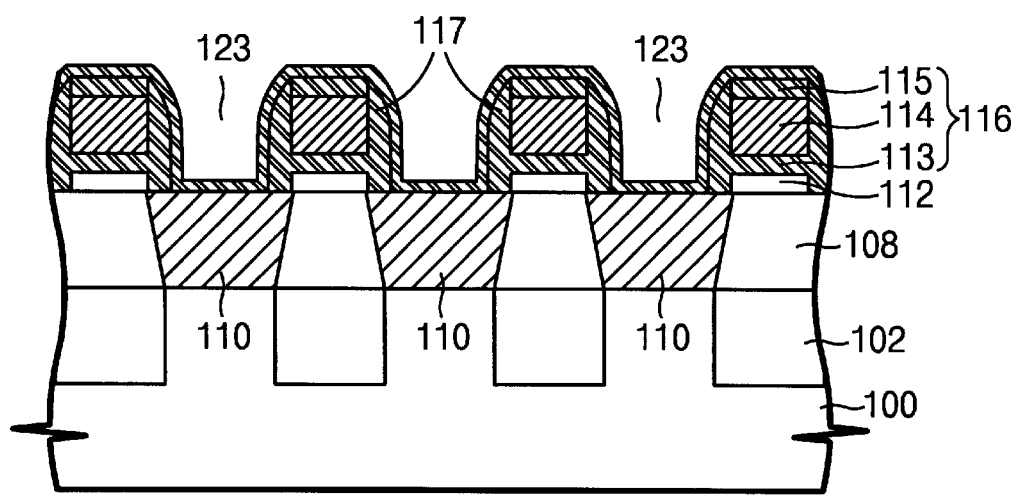

Referring to FIGS. 2D and 3D, the third oxide layer 120 is etched by isotropic wet etching using the patterned masking photoresist layer 121 until the nitride layer 118 is exposed, thereby forming the landing pad contact holes 123. As shown in FIG. 2D, the nitride layer 118 prevents the first oxide layer 108 from being damaged at both sides of the gate electrode 106. Subsequently, the nitride layer 118 is etched back. Namely, one of the novel features of the present method is that the storage node landing pad contact hole 123 is expanded by the isotropic wet etching the third oxide layer 120 which is etched by the previous anisotropic dry etching step. Since wet etching is isotropical and allows an oxide layer 108 to have an excellent etching selectivity with respect to the nitride layer 118, electrical connection between the later-formed storage node landing pad and the bit line self-aligned contact pad 110a can be prevented.

Figure 2E:
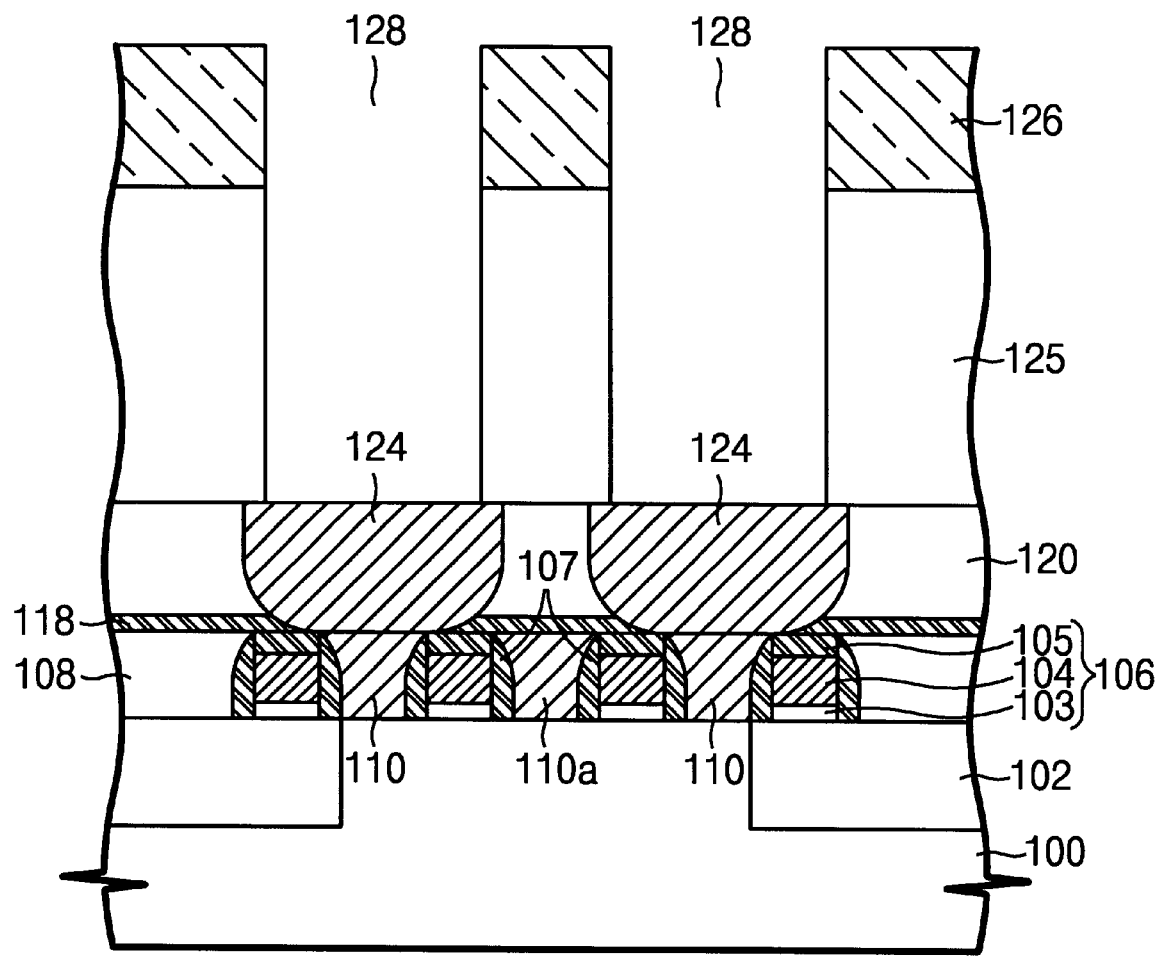
Figure 3E:
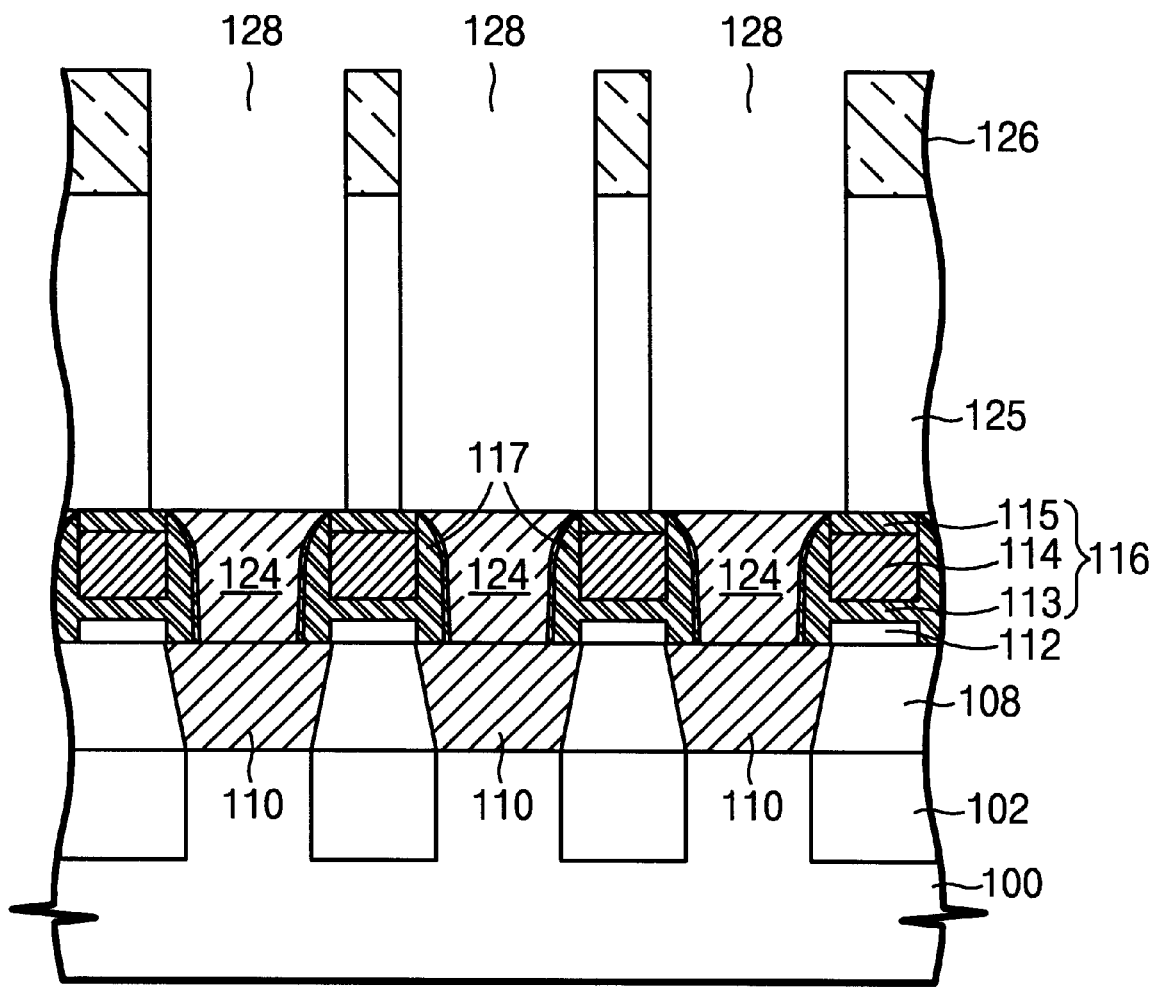

Referring to FIGS. 2E and 3E, after removing the patterned masking photoresist layer 121, a polysilicon layer is deposited over the third oxide layer 120 and the storage node landing pad contact holes 123. The polysilicon layer and third oxide layer 120 are planarized by CMP with the bit line mask nitride layer 115 serving as an etch barrier, thereby forming the storage node landing pads 124 electrically connected with the self-aligned contact pads 110. The storage node landing pads 124 are isolated from each other by mask nitride layer 115 and third oxide layer 120. Subsequently deposited over the substrate 100 is a fourth oxide layer 125, which is dry etched according to a patterned masking photoresist layer 126 to expose the upper surfaces of the storage node land pads 124 and bit line mask nitride layer 115 so as to form openings 128.

Figure 2F:
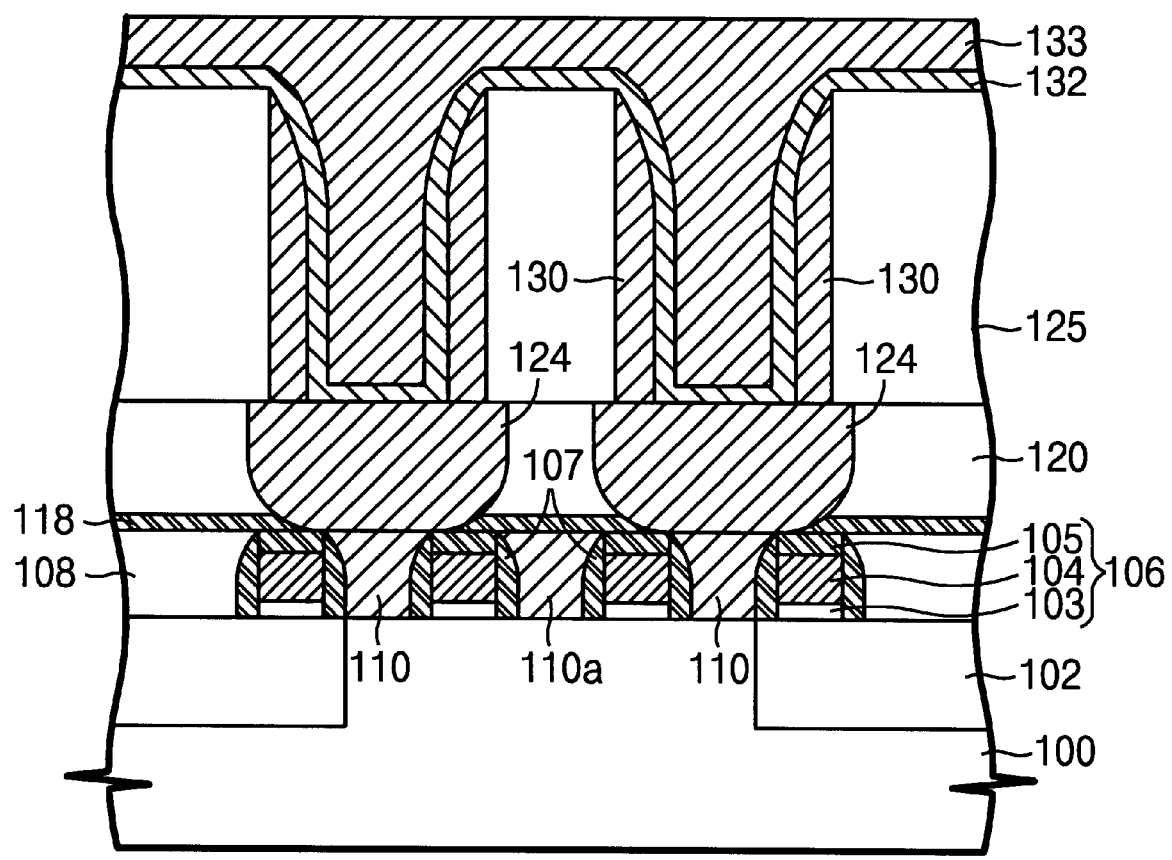
Figure 3F:
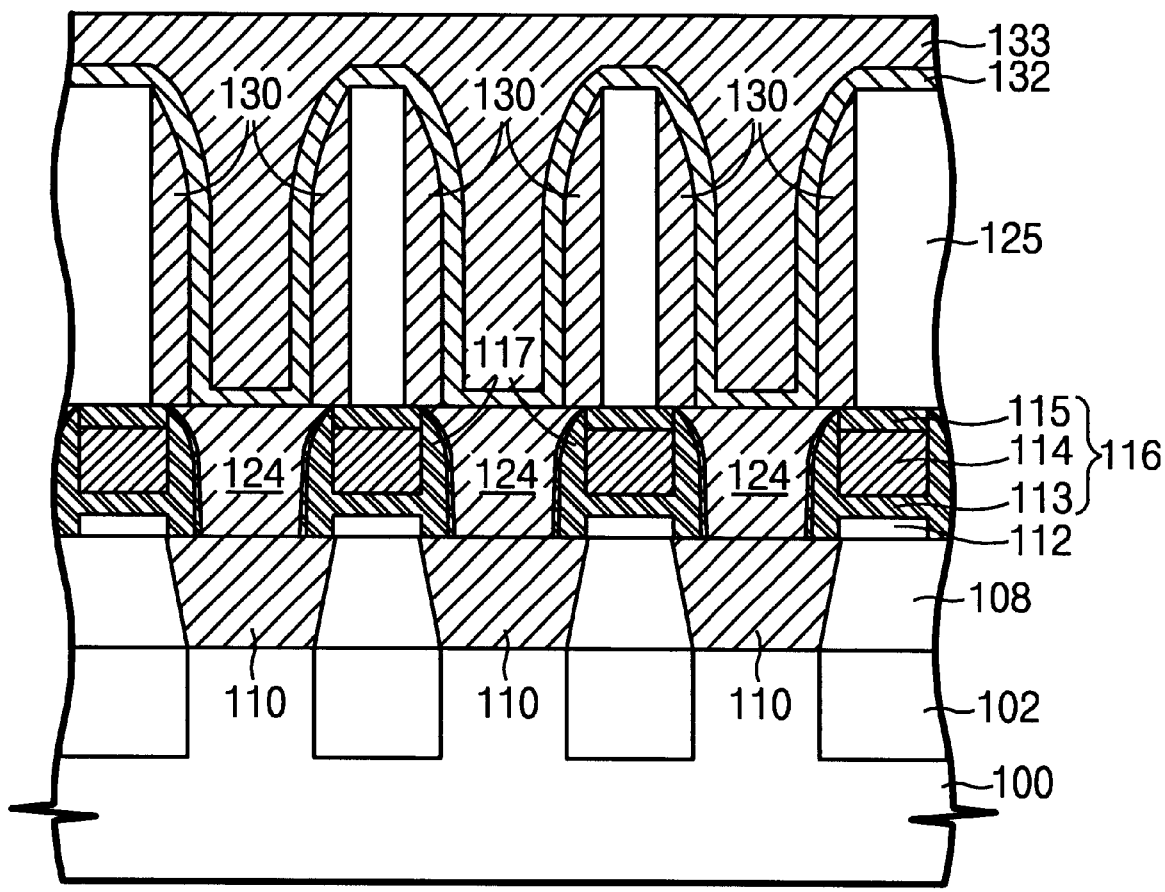
Figure 5:
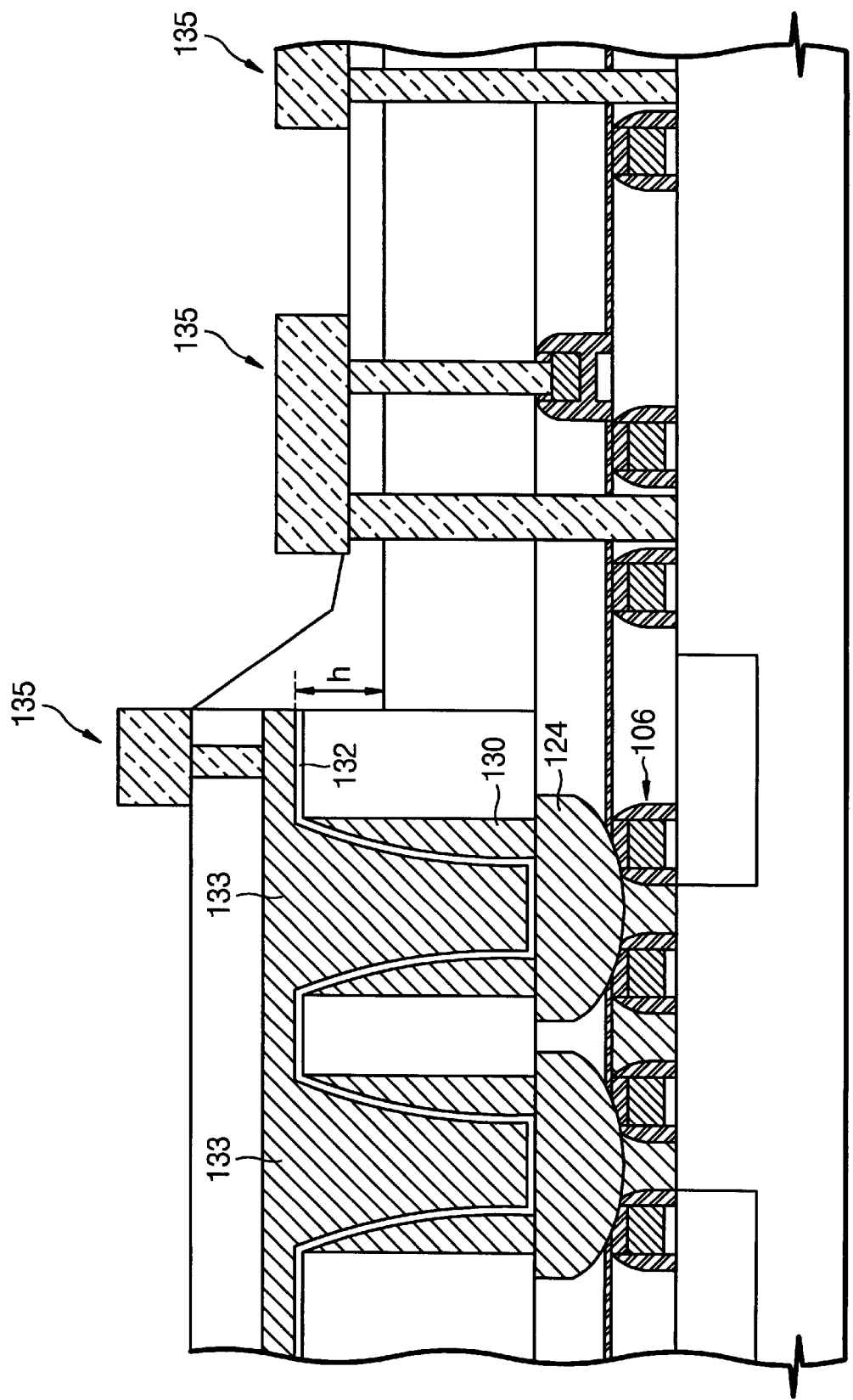
FIG. 5 is a cross sectional view for illustrating the level difference between the inventive cell and the peripheral circuit.

Referring to FIGS. 2F and 3F, a polysilicon layer is deposited over the fourth oxide layer 125 including the openings 128. Then, a dry etching process is carried out to form lower electrodes 130 of the capacitor by etching-back the polysilicon layer on the fourth oxide layer 125 separating the electrodes from each other. The capacitor dielectric layer 132 is formed over the fourth oxide layer 125, lower electrode 130 and storage node landing pad 124. Alternatively, CMP process may be used to isolate each electrode. Namely, after depositing the polysilicon layer, a planarization oxide layer is deposited On the polysilicon layer to completely fill the opening. CMP process is carried out until the fourth insulating layer is exposed, thereby forming lower electrodes which are electrically isolated from one another. The capacitor dielectric layer 132 may be composed of $Ta_2O_5$. Finally, a polysilicon layer is deposited over the openings 128 to form an upper electrode 133 of the capacitor. In this case, the cross section of the storage node is reduced compared to the conventional method because the spacer type lower electrodes 130 are formed on the sidewalls of contact holes within the oxide layer 125. Nonetheless, the effective area of the capacitor is increased by forming the capacitor electrodes on the sidewalls of contact holes within the oxide layer 125 on storage node landing pads 124. Moreover, the storage nodes are prevented from being electrically connected to each other due to the oxide layer interposed between them. Optionally, the level difference "h" between the cell and core regions can be reduced as shown in FIG. 5 by limiting the etching of the fourth oxide layer 125 below 3000Å at the core region when patterning the upper electrode 113 in order to increase photolithographic margin for the subsequent process of forming the metal line 135.

While the present invention has been described in connection with specific embodiments accompanied by the attached drawings, it will be readily appreciated by those skilled in the art that various changes and modifications may be made thereto without departing the gist of the present invention.

What is claimed is:

1. A capacitor formed over a semiconductor substrate, comprising:
   a first insulating layer on said substrate;
   first and second self-aligned contact pads formed in the first insulating layer on said substrate;
   a second insulating layer formed over said first insulating layer;
   a landing pad formed in said second insulating layer and electrically connected to said first self-aligned contact pad;
   a third insulting layer formed over said second insulating layer and having a trench exposing said landing pad;
   a capacitor lower electrode formed in said trench to be electrically connected to said landing pad wherein said capacitor lower electrode is formed on sidewalls of said trench and extended toward said landing pad to overlap an edge part of said landing pad and expose a center part thereof; and
   a dielectric layer formed on said capacitor lower electrode, wherein said dielectric layer is in direct contact with said landing pad, and wherein a portion of said dielectric layer is formed directly on said exposed landing pad.

2. The capacitor according to claim 1, further comprising:
   transistors on said substrate,
   wherein said first and second self-aligned contact pads are formed between said transistors.

3. The capacitor according to claim 1, further comprising:
   bit lines in said first insulating layer and between said landing pad and an adjacent landing pad, to be electrically connected to said second self-aligned contact pad.

4. The capacitor according to claim 3, wherein
   upper and side surfaces of the bit lines are enclosed by an insulating material having an etching selectivity to oxide.

5. The capacitor according to claim 1, wherein
   said dielectric layer is formed of $Ta_2O_5$.

6. The capacitor according to claim 1, further comprising:
   a portion of a nitride layer formed between said first and second insulating layers.

7. A capacitor formed over a semiconductor substrate, comprising:
   a first insulating layer on said substrate;
   first and second self-aligned contact pads formed in the first insulating layer on said substrate;
   a second insulating layer formed over said first insulating layer;
   a landing pad formed in said second insulating layer and electrically connected to said first self-aligned contact pad;
   bit lines in said first insulating layer and between said landing pad and an adjacent landing pad, to be electrically connected to said second self-aligned contact pad, wherein upper and side surfaces of the bit lines are enclosed by an insulating material having an etching selectivity to oxide;
   a third insulting layer formed over said second insulating layer and having a trench exposing said landing pad;
   a capacitor lower electrode formed in said trench to be electrically connected to said landing pad; and
   a dielectric layer formed on said capacitor lower electrode, wherein said dielectric layer is in direct contact with said landing pad.

8. The capacitor according to claim 7, wherein
   said capacitor lower electrode is formed on sidewalls of said trench and extended toward said landing pad to overlap an edge part of said landing pad and expose a center part thereof, and
   a portion of said dielectric layer is formed directly on said exposed landing pad.

9. The capacitor according to claim 7, further comprising:
   transistors on said substrate,
   wherein said first and second self-aligned contact pads are formed between said transistors.

10. The capacitor according to claim 7, wherein
    said dielectric layer is formed of $Ta_2O_5$.

11. The capacitor according to claim 7, further comprising:
    a portion of a nitride layer formed between said first and second insulating layers.

* * * * *